United States Patent
Busch

(10) Patent No.: US 7,019,607 B2
(45) Date of Patent: Mar. 28, 2006

(54) PRECISION NON-CONTACT DIGITAL SWITCH

(75) Inventor: Nicholas F. Busch, Freeport, IL (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/914,407

(22) Filed: Aug. 9, 2004

(65) Prior Publication Data

US 2006/0028308 A1 Feb. 9, 2006

(51) Int. Cl.
*H01H 9/00* (2006.01)

(52) U.S. Cl. .................. 335/207; 335/205
(58) Field of Classification Search ........ 335/205–207, 335/215; 200/181
See application file for complete search history.

(56) References Cited

U.S. PATENT DOCUMENTS

| | | | |
|---|---|---|---|
| 6,066,966 A | 5/2000 | Kuo | 327/55 |
| 6,457,545 B1 | 10/2002 | Michaud et al. | 180/272 |
| 6,492,697 B1 | 12/2002 | Plagens et al. | 257/426 |
| 6,612,404 B1 | 9/2003 | Sweet et al. | 187/395 |
| 6,648,092 B1 | 11/2003 | Michaud et al. | 180/272 |
| 6,900,713 B1 * | 5/2005 | Kasashima et al. | 335/205 |
| 2003/0090265 A1 | 5/2003 | Wan et al. | 324/207.25 |
| 2003/0122641 A1 * | 7/2003 | Luetzow | 335/205 |
| 2004/0095218 A1 * | 5/2004 | Wan et al. | 335/207 |

* cited by examiner

*Primary Examiner*—Lincoln Donovan
(74) *Attorney, Agent, or Firm*—Kermit D. Lopez; Luis M. Ortiz

(57) ABSTRACT

A switch apparatus, system and method are disclosed herein, including one or more magnetic sensing elements that follow a travel path thereof, and a plurality of permanent magnets located in a mirrored configuration about the travel path. Such a configuration permits a magnetic field variation associated with the permanent magnets and the magnetic sensing element to be reduced with respect to the magnetic sensing element and the permanent magnets position tolerances, thereby generating a reduced magnetic field variation thereof which improves switching accuracy. A signal processing module can also be provided, which includes a signal conditioning circuit associated with a microprocessor.

16 Claims, 5 Drawing Sheets

PRECISION NON-CONTACT DIGITAL SWITCH

TECHNICAL FIELD

Embodiments are generally related to switching methods and systems. Embodiments are also related magnetic sensing elements, such as Hall-effect, GMR (Giant Magnetoresistive) and AMR (Anisotropic Magnetoresistive) elements. Embodiments are additionally related signal processing electronics and permanent magnets.

BACKGROUND OF THE INVENTION

Switching devices are utilized in a variety of industrial, commercial and consumer applications, including for example, automotive and aerospace application, along with including navigation, position sensing, current sensing, vehicle detection, and rotational displacement. Many switches rely upon magnetic sensing elements, such as Hall-effect, GMR (Giant Magnetoresistive) and AMR (Anisotropic Magnetoresistive) elements.

There are many types of magnetic sensing devices, but essentially they all provide at least one output signal that represents the magnetic field sensed by the device. The Earth, magnets, and electrical currents can all generate magnetic fields. The sensor may be able to detect the presence, the strength, and/or the direction of the magnetic field. The strength of the magnetic field may be represented by a magnitude and a polarity (positive or negative). The direction of the magnetic field may be described by its angular position with respect to the sensor. One of the benefits of using magnetic sensors is that the output of the sensor is generated without the use of contacts. This is a benefit because over time contacts can degrade and cause system failures.

A Hall-effect sensor (also referred to simply as a "Hall" sensor") is a type of magnetic sensor that uses the Hall effect to detect a magnetic field. The Hall effect occurs when a current-carrying conductor is placed into a magnetic field. A voltage is generated perpendicular to both the current and the field. The voltage is proportional to the strength of the magnetic field to which it is exposed. The current-carrying conductor is called a Hall or Hall-effect element and it is typically composed of a semiconductor material.

Another type of magnetic sensing device is a magnetoresistive (MR) sensor, which utilizes an MR element. MR sensors are a type of magnetic sensor that uses the magnetoresistive effect to detect a magnetic field. Ferromagnetic metals, such as the nickel-iron alloy commonly known as Permalloy, alter their resistivity in the presence of a magnetic field. When a current is passed through a thin ferromagnetic film in the presence of a magnetic field, the voltage will change. This change in voltage represents the strength or direction of the magnetic field. By designing an MR sensor in a Wheatstone bridge configuration, either the strength or direction of the magnetic field can be measured. MR sensors provide a high-sensitivity and high-accurate output. A device related to an MR element is a GMR (Giant Magnetoresistive) element.

One of the problems with conventional switching devices employing such magnetic sensing elements is that these types of devices are very sensitive to magnet and magnetic sensing element tolerances, which results in a low accuracy at the switching point and/or increased assembly mechanical tolerances required to achieve prescribed accuracies. A typical conventional switching device of this type employs only two magnets in a dual magnet configuration with respect to a Hall-effect or magnetic sensing element. A new configuration is therefore required, which overcomes these drawbacks, and which is generally more efficient and accurate than such conventional devices.

BRIEF SUMMARY OF THE INVENTION

The following summary of the invention is provided to facilitate an understanding of some of the innovative features unique to the present invention and is not intended to be a full description. A full appreciation of the various aspects of the invention can be gained by taking the entire specification, claims, drawings, and abstract as a whole.

It is, therefore, one aspect of the present invention to provide for improved switching devices, methods and systems.

It is another aspect of the present invention to provide for a precision non-contact digital switch.

It is yet another aspect of the present invention to provide for a non-contact digital switch apparatus, including methods and systems thereof, which include a magnetic sensing element, signal processing electronics, and one or more permanent magnets.

It is still a further aspect of the present invention to provide for a non-contact digital switch apparatus, including methods and systems thereof, with improved accuracy of the switch point and/or decreased assembly mechanical tolerances to achieve a prescribed accuracy.

The aforementioned aspects of the invention and other objectives and advantages can now be achieved as described herein. A switch apparatus, system and method are disclosed herein, including one or more magnetic sensing elements that follow a travel path thereof, and a plurality of permanent magnets located in a mirrored configuration about the travel path. Such a configuration permits a magnetic field variation associated with the permanent magnets and the magnetic sensing element to be reduced with respect to the magnetic sensing element and the permanent magnets position tolerances, thereby generating a reduced magnetic field variation thereof which improves switching accuracy. A signal processing module can also be provided, which includes a signal conditioning circuit associated with a microprocessor. The signal conditioning circuit receives data from one or more of the magnetic sensing elements for signal conditioning and outputs data to the microprocessor for processing thereof.

The magnetic sensing element(s) can be configured as, for example, a Hall-effect element, a GMR (Giant Magnetoresistive) element, an AMR (Anisotropic Magnetoresistive) element and/or another type of electric transducer. The permanent magnets can be arranged in a configuration of four permanent magnets, wherein two of the four permanent magnets are located on one side of the travel path and two remaining of the four permanent magnets are located on the opposite side of the travel path. By adding additional magnets mirrored about the magnetic sensing element (e.g., a Hall-effect element, GMR, AMR, etc.) travel path, the magnetic field variation can be reduced with respect to the magnet to magnetic sensing element assembly position tolerances. The reduced magnetic field variation can therefore improve switching accuracy.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

The particular values and configurations discussed in these non-limiting examples can be varied and are cited merely to illustrate at least one embodiment of the present invention and are not intended to limit the scope of the invention.

Figure 1:
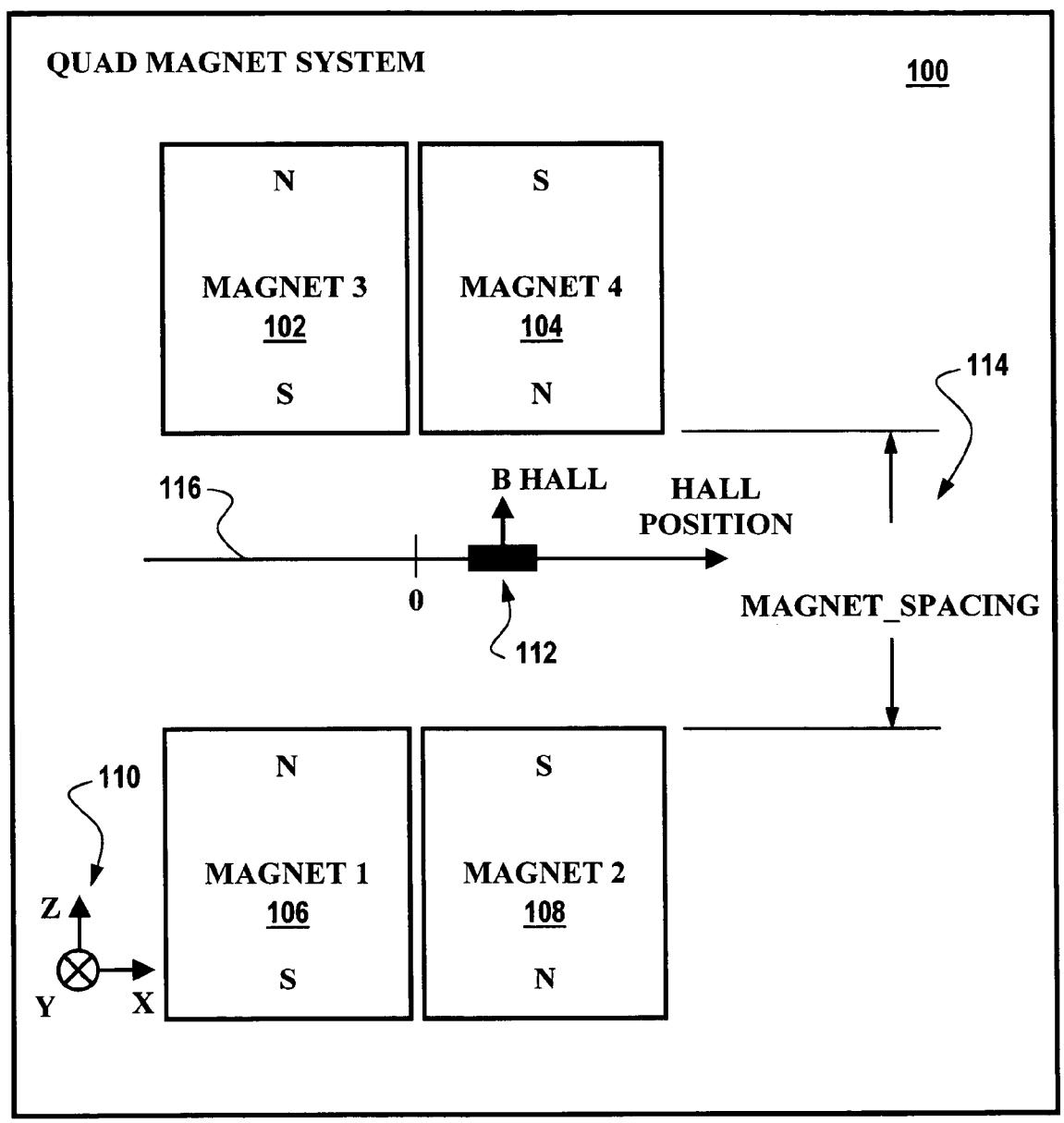
FIG. 1 illustrates a block diagram of quad magnet system, which can be implemented in accordance with a preferred embodiment.

FIG. 1 illustrates a block diagram of quad magnet system 100, which can be implemented in accordance with a preferred embodiment. System 100 can be implemented in the context of a non-contact digital switch. System 100 can be configured to include one or more magnetic sensing element(s) 112 that follows a travel path thereof, which is indicated by arrow 116. A plurality of permanent magnets 102, 104, 106, 108 can be located in a mirrored configuration about the travel path indicated by arrow 116, such that the magnetic field variation associated with permanent magnets 102, 104, 106, 108 and the magnetic sensing element 112 can be reduced with respect to magnetic sensing element 112 and permanent magnets 102, 104, 106, 108 position tolerances, thereby generating a reduced magnetic field variation thereof which improves switching accuracy. Magnetic force and/or directional components 112 are associated with system 100, indicating general magnetic field directions with respect to permanent magnets 102, 104, 106, 108 and magnetic sensing elements 112. A gap or spacing 114 is also depicted in FIG. 1, indicated the spacing between magnets 102, 104 and magnets 106, 108.

Magnetic sensing element 112 can be implemented, for example, as a Hall-effect element. An example of a Hall-effect sensing element, which may be adapted for use with an embodiment of the present invention is disclosed in U.S. Pat. No. 6,492,697, entitled "Hall-effect element with integrated offset control and method for operating hall-effect element to reduce null offset," which issued to Plagens et al on Dec. 10, 2002, and is assigned to Honeywell International, Inc. U.S. Pat. No. 6,492,697 is incorporated herein by reference. Note that U.S. Pat. No. 6,492,697 is referenced for illustrative and edification purposes only and is not considered a limiting feature of the invention. Although a Hall-effect element is discussed herein with respect to a preferred embodiment, it can be appreciated that other types of magnetic sensing elements can be adapted for use with alternative embodiments, including, for example, GMR (Giant Magnetoresistive) and AMR (Anisotropic Magnetoresistive) elements.

Figure 2:
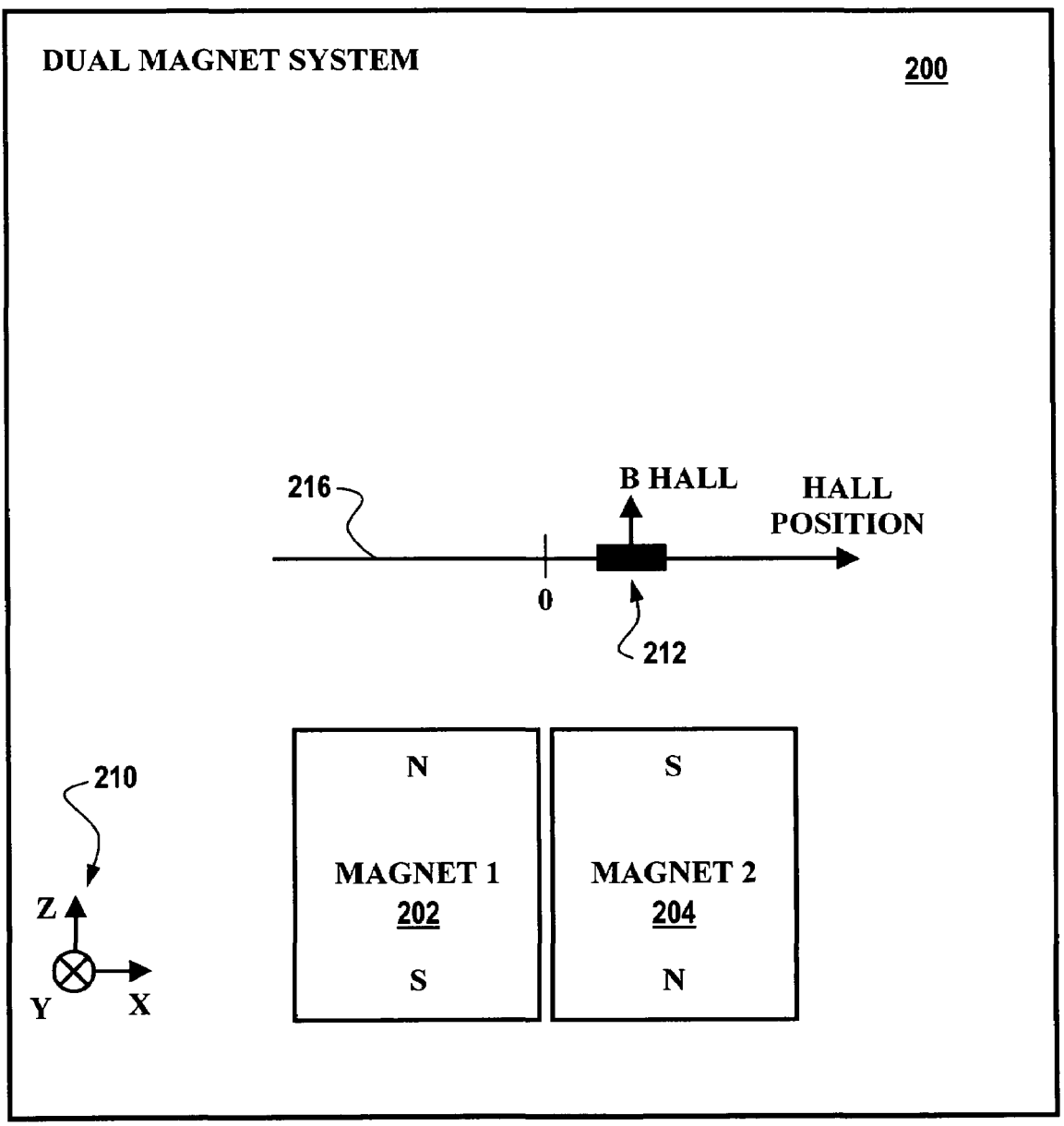
FIG. 2 illustrates a block diagram of a conventional dual magnet system.

FIG. 2 illustrates a block diagram of a conventional dual magnet system 200 that includes dual magnets 202, 204 located to one side only of the travel path of a Hall-effect element 212. Such a travel path is indicated in FIG. 2 by arrow 216. Additionally, magnetic force and/or directional components 210 are associated with system 200, indicating general magnetic field directions with respect to permanent magnets 202, 204 and the Hall-effect element 212. The dual magnet system 200 is illustrated herein to demonstrate the deficiencies of such conventional systems.

A configuration or system such as system 200 is much more sensitive to Hall-effect position tolerances than the system 100 depicted in FIG. 1. Therefore, system 100 is much less sensitive to magnet-to-Hall position tolerances than system 200, thereby allowing for improved accuracy of the switch point and/or decreased assembly mechanical tolerances required to achieve prescribed accuracies. Thus, by adding additional magnets mirrored about the Hall element travel path indicated by arrow 212, the magnetic field variation can be reduced with respect to magnet-to-Hall assembly position tolerances. The reduced magnetic field variation therefore improves accuracy. Such a reduced magnetic field variation can not be achieved by system 200 depicted in FIG. 2, but can be achieved by system 100 illustrated in FIG. 1.

Figure 3:
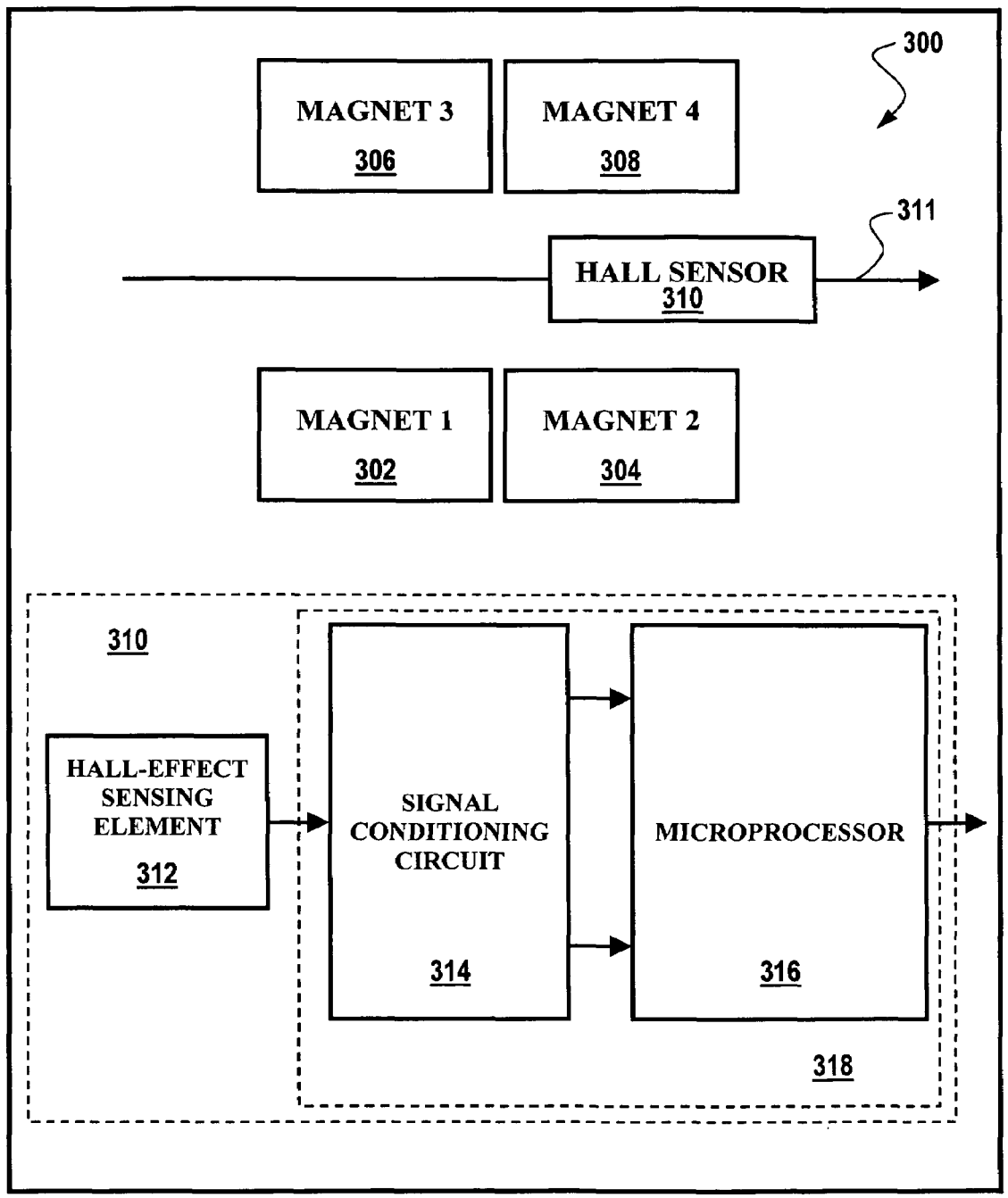
FIG. 3 illustrates a block diagram of a Hall switching system and a signal processing module, which can be implemented in accordance with a preferred embodiment.

FIG. 3 illustrates a block diagram of a Hall switching system 300 and a signal processing module 318, which can be implemented in accordance with a preferred embodiment. System 300 of FIG. 3 is analogous to system 100 of FIG. 1. System 300 can be implemented in the context of a non-contact digital switch and can include one or more magnetic sensing element(s) 310 that follows a travel path thereof, which is indicated by arrow 311. A plurality of permanent magnets 302, 304, 306, 308 can be located in a mirrored configuration about the travel path indicated by arrow 311, such that the magnetic field variation associated with permanent magnets 302, 304, 306, 308 and the Hall sensor apparatus 310 can be reduced with respect to Hall sensor apparatus 310 and permanent magnets 302, 304, 306, 308 position tolerances, thereby generating a reduced magnetic field variation thereof which improves switching accuracy.

Hall sensor apparatus 310 is indicated in greater detail in FIG. 3 to include a Hall-effect sensing element 312 that provides data to a signal-conditioning circuit 314, which in turn provides output to a microprocessor 316. Signal conditioning circuit 314 is generally associated with microprocessor 316 to form a signal-processing module 318. Microprocessor 316 can function as a central processing unit (CPU) implemented in the context of one or more integrated circuit (IC) chips. Microprocessor 316 generally interprets and executes instructions, and possesses the ability to fetch, decode and executed such instructions and to transfer information and data to and from other system resources.

Figure 4:
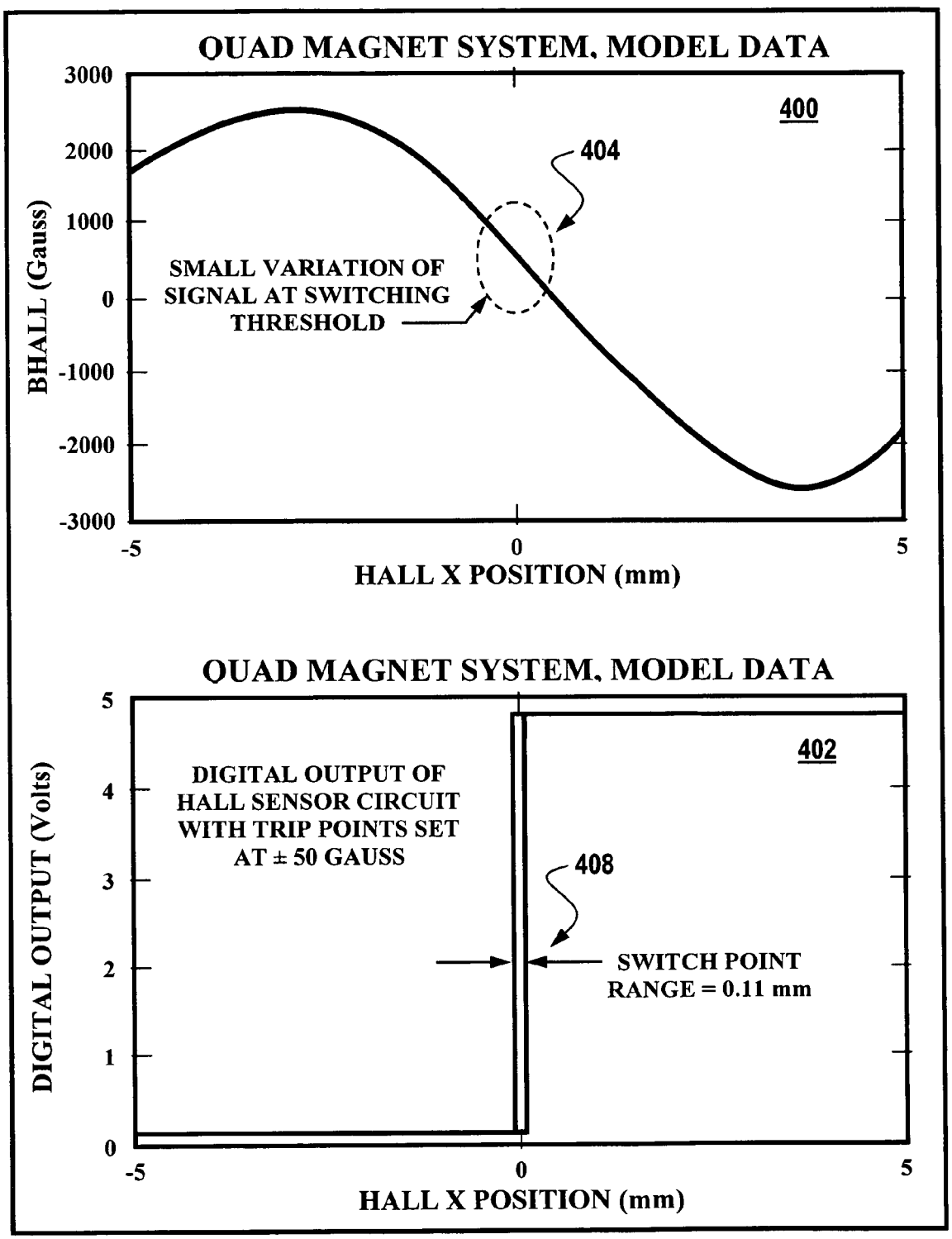
FIG. 4 illustrates graphs depicting quad magnet system generated switching data, in accordance with one embodiment.

FIG. 4 illustrates graphs 400 and 402 depicting quad magnet system generated switching data, in accordance with one embodiment. Graph 400 generally illustrates data, which can be produced by system 100 and/or system 300 illustrated and described herein. Graph 400, for example, indicates a gauss range (y-axis) of approximately −3000 Gauss to +3000 Gauss versus a Hall position x-axis) of −5 mm to +5 mm. There are nine plots on the graph 400, wherein each plot indicates a different y and z Hall position. Graphs 400 and 402 therefore contain every possible combination of the y-position equal to −0.25, 0.00, 0.25 mm and of the z-position equal to −0.25, 0.00, 0.25. Each magnet in the system 300, for example, can be implemented, as a 5 mm cube that possesses a residual magnetic flux density of approximately 10000 Gauss. Magnet spacing can be, for example, 4.8 mm. As indicated by dashed circle 404 of graph 400, the variation of signal at switching thresholds is small. Graph 402 describes digital output (y-axis) in a range of approximately 0 V to 5 V versus a Hall position (x-axis) of −5 mm to +5 mm. A switching point range 408 is indicated in graph 402 with a switch point range of approximately 0.11 mm.

Figure 5:
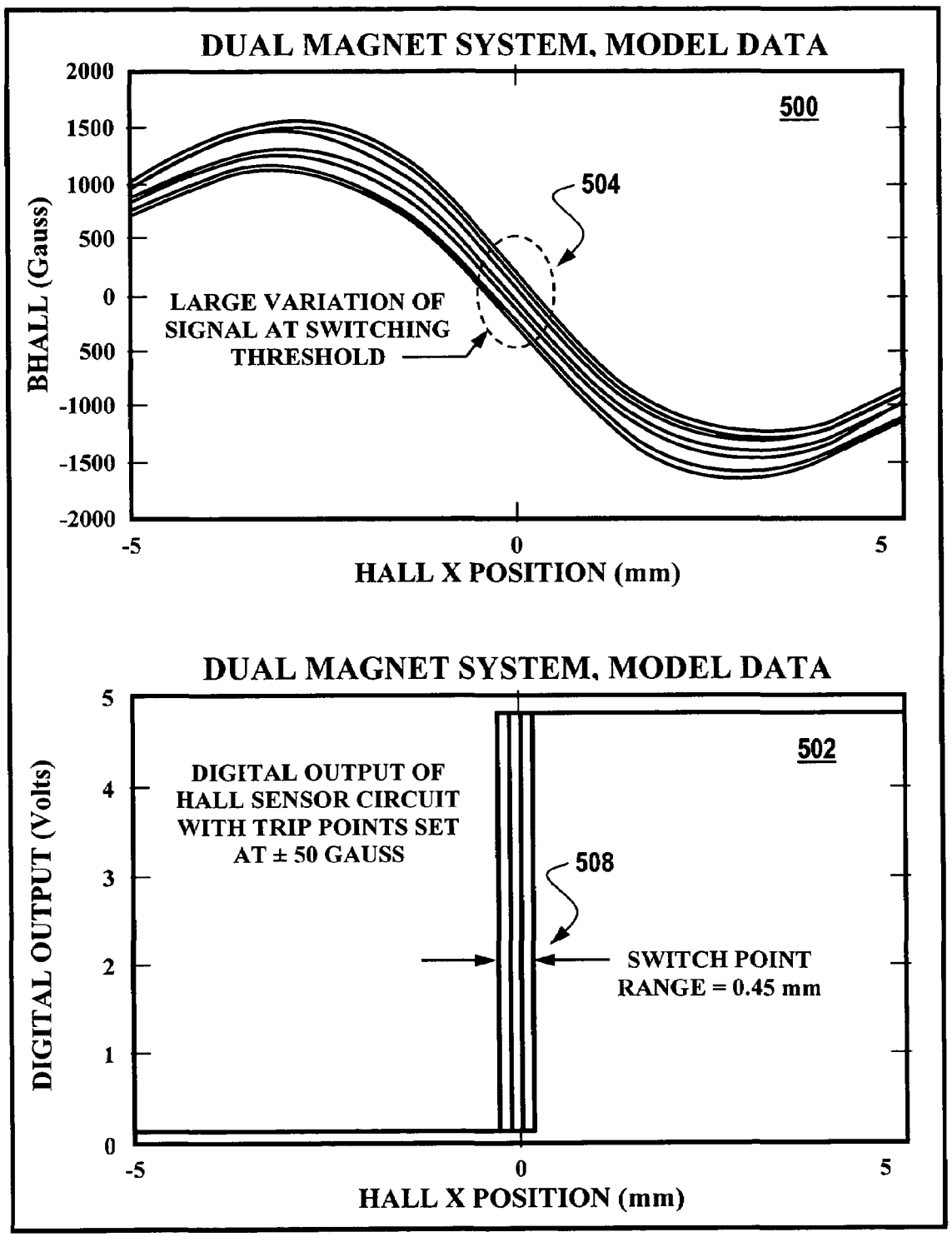
FIG. 5 illustrates graphs depicting conventional dual magnet system generated switching data.

FIG. 5 illustrates graphs 500 and 502 depicting conventional dual magnet system generated switching data. Graph 500 generally indicates data, which is typically produced by conventional system 200 of FIG. 2. Graph 500, for example, illustrates a gauss range (y-axis) of approximately −2000 Gauss to +2000 Gauss versus a Hall position (x-axis) of −5 mm to +5 mm. There are nine plots on the graphs 500 and 502, wherein each plot thereof indicates different y and z Hall positions. The graphs 500 and 502 contain every possible combination of the y-position equal to −0.25, 0.00, 0.25 mm and of the z-position equal to −0.25, 0.00, 0.25. Each magnet in the system 200, for example, can be implemented as a 5 mm cube with a residual magnetic flux density of approximately 10000 Gauss. The magnet spacing can be, for example, 4.8 mm. As indicated by dashed circle 504 of graph 500, a large variation of signal is present at the switching threshold. Graph 502 describes digital output (y-axis) in a range of approximately 0 V to 5 V versus a Hall position (x-axis) of −5 mm to +5 mm. A switching point range 508 is indicated in graph 502 with a switch point range of approximately 0.45 mm, which is quite large in comparison to the data generated by graphs 400 and 402 of FIG. 2.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered.

The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

What is claimed is:

1. A switch apparatus, comprising:
   at least one magnetic sensing element that follows a travel path located between a plurality of permanent magnets; and
   a plurality of permanent magnets located in a mirrored configuration about said travel path such that a magnetic field variation associated with said plurality of permanent magnets and said at least one magnetic sensing element is reduced with respect to said at least one magnetic sensing element and said plurality of permanent magnets, thereby generating a reduced magnetic field variation which improves switching accuracy during a magnetic sensing operation of said switch apparatus due to a decrease in a sensitivity to permanent magnet-to-magnetic sensing element position tolerances.

2. The apparatus of claim 1 further comprising a signal processing module.

3. The apparatus of claim 2 wherein said signal processing module comprises a signal conditioning circuit associated with a microprocessor, wherein said signal conditioning circuit receives data from said at least one magnetic sensing element for signal conditioning and output to said microprocessor for processing thereof.

4. The apparatus of claim 1 wherein said at least one magnetic sensing element comprises a Hall-effect element.

5. The apparatus of claim 1 wherein said at least one magnetic sensing element comprises an electric transducer.

6. The apparatus of claim 1 wherein said plurality of permanent magnets comprises four permanent magnets, wherein two of said four permanent magnets are located on one side of said travel path and two remaining of said four permanent magnets are located on an opposite side of said travel path.

7. A switch system, comprising:
   at least one magnetic sensing element that follows a travel path located between a plurality of permanent magnets;
   a plurality of permanent magnets located in a mirrored configuration about said travel path such that a magnetic field variation associated with said plurality of permanent magnets and said at least one magnetic sensing element is reduced with respect to said at least one magnetic sensing element and said plurality of permanent magnets, thereby generating a reduced magnetic field variation thereof which improves switching accuracy during a magnetic sensing operation of said switch apparatus due to a decrease in a sensitivity to permanent magnet-to-magnetic sensing element position tolerances; and
   a signal processing module comprising a signal conditioning circuit and a microprocessor, wherein said signal conditioning circuit receives data from said at least one magnetic sensing element for signal conditioning and output to said microprocessor for processing thereof.

8. The apparatus of claim 7 wherein said at least one magnetic sensing element comprises a Hall-effect element.

9. The apparatus of claim 7 wherein said at least one magnetic sensing element comprises an electric transducer.

10. The apparatus of claim 7 wherein said plurality of permanent magnets comprises four permanent magnets, wherein two of said four permanent magnets are located on one side of said travel path and two remaining of said four permanent magnets are located on an opposite side of said travel path.

11. A switch method, comprising the steps of:
    providing at least one magnetic sensing element that follows a travel path located between a plurality of permanent magnets; and
    locating a plurality of permanent magnets in a mirrored configuration about said travel path such that a magnetic field variation associated with said plurality of permanent magnets and said at least one magnetic sensing element is reduced with respect to said at least one magnetic sensing element and said plurality of permanent magnets, thereby generating a reduced magnetic field variation thereof which improves switching accuracy during a magnetic sensing operation of said switch apparatus due to a decrease in a sensitivity to permanent magnet-to-magnetic sensing element position tolerances.

12. The method of claim 11 further comprising the step of providing a signal processing module that communicates with said at least one magnetic sensing element and processes data generated by said at least one magnetic sensing element.

13. The method of claim 12 further comprising the step of configuring said signal processing module to comprise a signal conditioning circuit associated with a microprocessor, wherein said signal conditioning circuit receives data from said at least one magnetic sensing element for signal conditioning and output to said microprocessor for processing thereof.

14. The method of claim 11 wherein said at least one magnetic sensing element comprises a Hall-effect element.

15. The apparatus of claim 11 wherein said at least one magnetic sensing element comprises at least one of the following: a GMR (Giant Magnetoresistive) element, an AMR (Anisotropic Magnetoresistive) element, or an electric transducer.

16. The apparatus of claim 11 further comprising the step of configuring said plurality of permanent magnets to comprise four permanent magnets, wherein two of said four permanent magnets are located to one side of said travel path and two remaining of said four permanent magnets are located on an opposite side of said travel path.

* * * * *